United States Patent
Milton et al.

[11] 4,054,797
[45] Oct. 18, 1977

[54] SERIES-PARALLEL SCAN, IR, CID, FOCAL-PLANE ARRAY

[75] Inventors: A. Fenner Milton, Washington, D.C.; Michael R. Hess, Doylestown, Pa.

[73] Assignee: The United States of America as represented by the Secretary of the Navy, Washington, D.C.

[21] Appl. No.: 725,769

[22] Filed: Sept. 23, 1976

[51] Int. Cl.² ............................................. G01T 1/24
[52] U.S. Cl. ................................. 250/332; 250/334; 250/370
[58] Field of Search ............... 250/330, 332, 334, 370

[56] References Cited

U.S. PATENT DOCUMENTS

| | | | |
|---|---|---|---|
| 3,806,729 | 4/1974 | Caywood | 250/370 X |
| 3,808,435 | 4/1974 | Bate et al. | 250/332 |
| 3,842,274 | 10/1974 | Greene et al. | 250/330 |
| 3,883,437 | 5/1975 | Nummedal et al. | 250/332 |
| 3,902,066 | 8/1975 | Roosild et al. | 250/332 |

Primary Examiner—Archie R. Borchelt
Attorney, Agent, or Firm—R. S. Sciascia; Philip Schneider

[57] ABSTRACT

A series-parallel scan, IR, focal plane array which uses small InSb CID modules. The CID is used to premultiplex photocurrent through a preamplifier before the photosignal is introduced into a Si CCD TDI signal processor.

13 Claims, 4 Drawing Figures

SERIES-PARALLEL SCAN, IR, CID, FOCAL-PLANE ARRAY

BACKGROUND OF THE INVENTION

This invention relates to infrared (IR) charge-injection devices and especially to two-dimensional, infrared, charge-injection-device arrays used in a series-parallel scan mode.

The development of charge-coupled device (CCD) and charge-injection device (CID) area-imaging arrays for $\lambda < 1 \mu m$ has encouraged the infrared community to examine the application of these technologies to infrared focal planes. For terrestial applications the interest is primarily in the development of new kinds of thermal imagers for the 3-5 $\mu m$ and 8-12 $\mu m$ atmospheric windows. It is expected that the use of the CCD's at or near focal plane will permit the use of thousands of IR detectors in a focal plane at reasonable cost with good signal-to-noise ratios.

CCD and CID structures can be fabricated in materials sensitive to infrared radiation; however CCD and CID structures which are appropriate for the visible and very near infrared are not necessarily appropriate for thermal imaging systems. Because of the low contrast thermal imagery, a DC-coupled starting sensor would have difficulty distinguishing between variations in detector responsivity and variations in image irradiance. For example, net detector-to-detector responsivity uniformity in an unscanned array would need to be better than 0.35% in the 3.4–5.1 $\mu m$ band in order not to compete with apparent target-temperature differences of 0.1° C.

The use of two-dimensional arrays in a mechanically scanned series-parallel configuration using time delay and integration (TDI) and an effective AC coupling of the detector with the image avoids these stringent uniformity requirements. Also TDI provides built-in redundancy in that a few dead detectors can be tolerated without significantly degrading the imagery.

The technical approach to a high-packing-density array for series-parallel scan, which do date has received the most investigation, mates conventional InSb photodiodes with a SI CCD chip to form a InSb photodiode-Si CCD sandwich focal-plane module. Such a module is shown and described in U.S. Pat. No. 3,883,437, issued May 13, 1975. Several modules would be used to form a focal plane of thousands of detectors. With this approach each detector is individually connected to a direct-injection input circuit which inputs photocurrent into a silicon TDI CCD register. This method of inputting photocurrent into a Si CCD requires a connection for each detector and has certain signal-to-noise limitations. Preamplifiers between the detector and the CCD have not been used to data due to packing density considerations.

SUMMARY OF THE INVENTION

An alternative to the sandwich/direct-injection focal-plane-array structure discussed above is the series-parallel scan, 2-dimensional CID array shown in FIG. 1 which is based on the CID in InSb developed by Kim. (For details, see J. C. Kim, "InSb MIS Structures for Infrared Imaging Device," Techncal Digest, 1973, IEDM, Washington, D.C., p. 419, which is incorporated herein be reference). The CID in effect premultiplexes the photocurrent through a preamplifier before it is inserted into a Si CCD TDI register. High transfer efficiency in the CID array is not required since an x-y readout can be implemented. Connections must be made to the x-y readout lines on the CID module but, for the 384 detector module size suggested in FIG. 1, this is only 0.1 interconnect per detector. The CID modules must be read out more than once per dwell time, leading to high clock frequencies, but the premultiplexing feature allows the use of a small number of high-quality preamplifiers before introduction of the signal current into the CCD TDI signal processor. This can lead to improved signal-to-noise performance over direct injection. "Background rejection" equivalent to A.C. coupling is provided at the TDI output as with the sandwich/direct-injection structure.

DETAILED DESCRIPTION OF THE INVENTION

Figure 1:
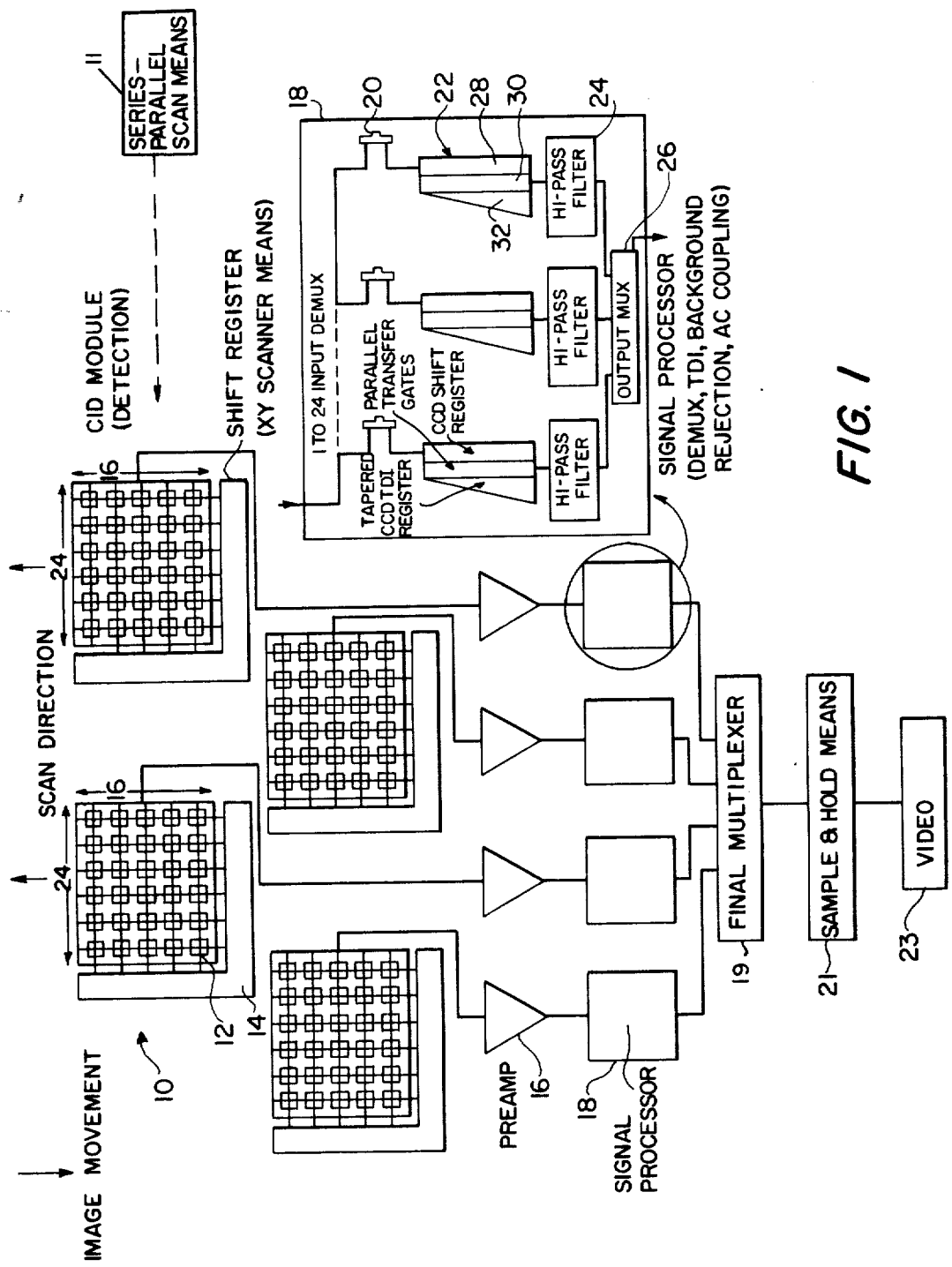
FIG. 1 is a block diagram of an embodiment of a series-parallel scan, two-dimensional, focal-plane array and associated circuits and devices in accordance with the present invention.

FIG. 1 shows an embodiment of the invention which is useful in an infrared (IR) imager or search set. A plurality of IR-sensitive CID modules 10 which may have detector elements 12 fabricated from InSb, for example, are arranged horizontally substantially in a row, in the focal plane of an IR image which is formed by optical means (not shown) such as lenses or mirrors. The optical means provided with means 11 to move the image down relative to the modules so that the scan direction is up, as shown. Alternately, of course, the module array could be moved in the upward direction.

CID module has one or more associated horizontal and vertical scan shift registers, or readout means, 14, which may be fabricated from silicon, and wiring to provide an x-y scan and readout of the charge in the detector elements. One way of doing this is to read out each element successively in the bottom row from left to right, then shift to the next higher row and readout each element from left to right, and so on, until the topmost row is read out. An entire module is read out in the time the image moves a distance $y/2$ on the focal plane, where $y$ is the detector element center-to-center spacing. Integration occurs in each element since photocurrent from its associated IR-sensitive element (not shown) keeps adding to the charge in the element during the time between each readout of the element.

The serial-pulse multiplexed output from a module 10 is fed to a preamplifier 16. (There may actually be more than one preamplifier in serial connection). The amplified signal is passed to a signal processor 18 which performs demultiplexing, time delay and integration (TDI), background rejection and A.C. coupling functions. The processor 18 is a CCD, which may be fabricated in silicon, for example. It contains a plurality of gates 20, register packages 22, high-pass filters 24 and an output multiplexer 26. Each gate 20 is switched open at the proper time to pass the incoming signal from its associated preamplifier 16 to a register package 22. The output from the register package 22 goes through a high-pass filter 24 which provides background rejection and A.C. coupling and the outputs of all high-pass filters in the module 18 are then multiplexed once more by an output multiplexer 26. The multiplexed outputs of all the module multiplexers 26 are then fed to a final multiplexer 19 which forms them into a serial-pulse multiplexed output. This chain of output pulses is fed to a sample and hold means 21 and to video means 23 for display.

The register packages 22 in each signal processor module 18 consists of a sandwich of a first CCD shift register 28 to which the incoming signal from a preamplifier is fed, a set of parallel transfer gates 30 and a tapered TDI register 32. The registers 28 and 32 and the output multiplexer 26 are CCD devices.

Figure 2:
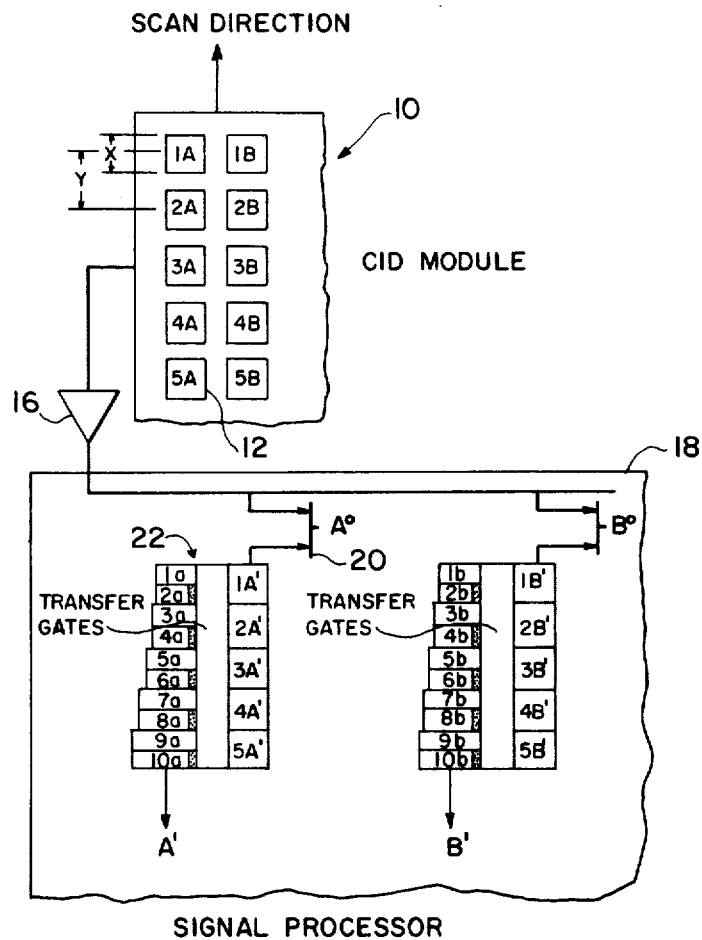
FIG. 2 is a partial block diagram of a CID module and a signal processor which is useful for an understanding of the operation of the invention.

The scan and shifting operations of the CID and CCD modules 10 and 18 and the structure of the registers 28, 32 are better understood from FIG. 2. Only 5 elements are shown, rather than 16, for the sake of clarity.

When detector 5A is read out, gate A° is opened and the amplified signal charge is fed into CCD well 1A'. When detector 5B is read out, gate B° is opened and amplified charge is fed into CCd well 1B'. Before detector 4A is read out, the charge in 1A' is transferred to 2A' to make room for the charge 4A. This process continues until the entire CID module is read out and an amplified replica of the signal from detector 1A, 2A, 1B, 2B, etc., is stored in CCD wells 1A', 2A', 1B', 2B'. At that point, the transfer gates are opened and the charge in 1A' is transferred to 1a at the same time that charge 2A' is transferred to 3a, etc. After this parallel transfer, charge in 1a is moved to 2a the charge in 3a to 4a, the charge in 1b to 2b, etc., and the readout process is repeated. With the design shown in FIG. 2, integration occurs after the third readout when the charge in 2A' is added to the charge from 2a which originated two readout sequences ago from detector 1A and is now in register element 3a. A smaller ratio of sampling time to dwell time can be obtained by interleaving more CCD bits. The register 1a, 2a, etc. is tapered in width to be able to accomodate the increasingly large integrated charge.

The reason for having two storage bins in the tapered register for every bin in the first register is to provide for interlacing of the charges in the odd bins (1a, 3a, etc.) with the charges in the even bins (2a, 4a, etc.).

The time delay is inserted because of the time required to insert charge into each element in the first shift register 28, transfer it to the tapered shift register 32 and shift it down through the various storage bins therein to the output. (An illustration of a TDI device and an explanation of its operation are provided in the CCD Applications Conference Proceedings, September 1973, sponsored by the Naval Electronics Laboratory Center, San Diego, CA. in the article entitled "Buried Channel CCD's for IR Applicatons," by Erb and Nummedal, pp. 157-167).

Since the scan rate and the clock frequency are synchronized, the signals from the same point on the image from all the detectors in a column will add coherently. The noise adds incoherently so that TDI provides a $\sqrt{n}$ improvement in signal-to-noise where $n$ is the number of detectors in a column (16 as shown in FIG. 1). The Si signal processor chip used with the CID premultiplexer would be similar in design to that used with the sandwich approach except that, since it is removed from the focal plane, it can be much larger than the detector area, relieving packing density and CCD well-saturation limitations inherent in the sandwich approach.

Figure 3:
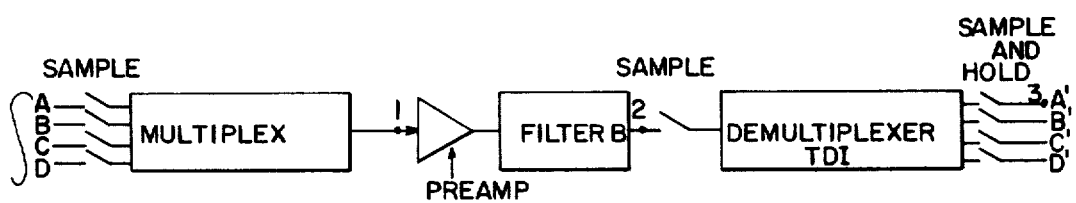
FIG. 3 is a block diagram illustrating the signal flow through one branch of the present device.

Performance of the CID IR focal plane is shown in FIG. 3. Signal and background photons are converted into charge in the CID. The CID detectors all integrate this charge for a time $T_s$, after which the integrated charge is sampled by the readout process, converted into a voltage, and amplified by the preamplifier which has an output bandwidth B. The amplified voltage is resampled before being reconverted into charge for input into the CCD signal processor. The signal processor performs TDI and outputs a number of pulse trains corresponding to the photosignal seen by each column of the CID as the image is scanned over the module.

The input signal is reconstructed by a sample-and-hold process on these pulse trains. At point 3 after the sample-and-hole, the signal will have the appearance of a staircase function, for the case of uniform focal plane irradiance. The variation of signal height represents noise.

The outputs of the CCD modules 18 are multiplexed and fed to sample-and-hold means 21 from which they can be read out and displayed by the video means 23 which may include a television-type screen for display of the scanned IR-image.

Figure 4:
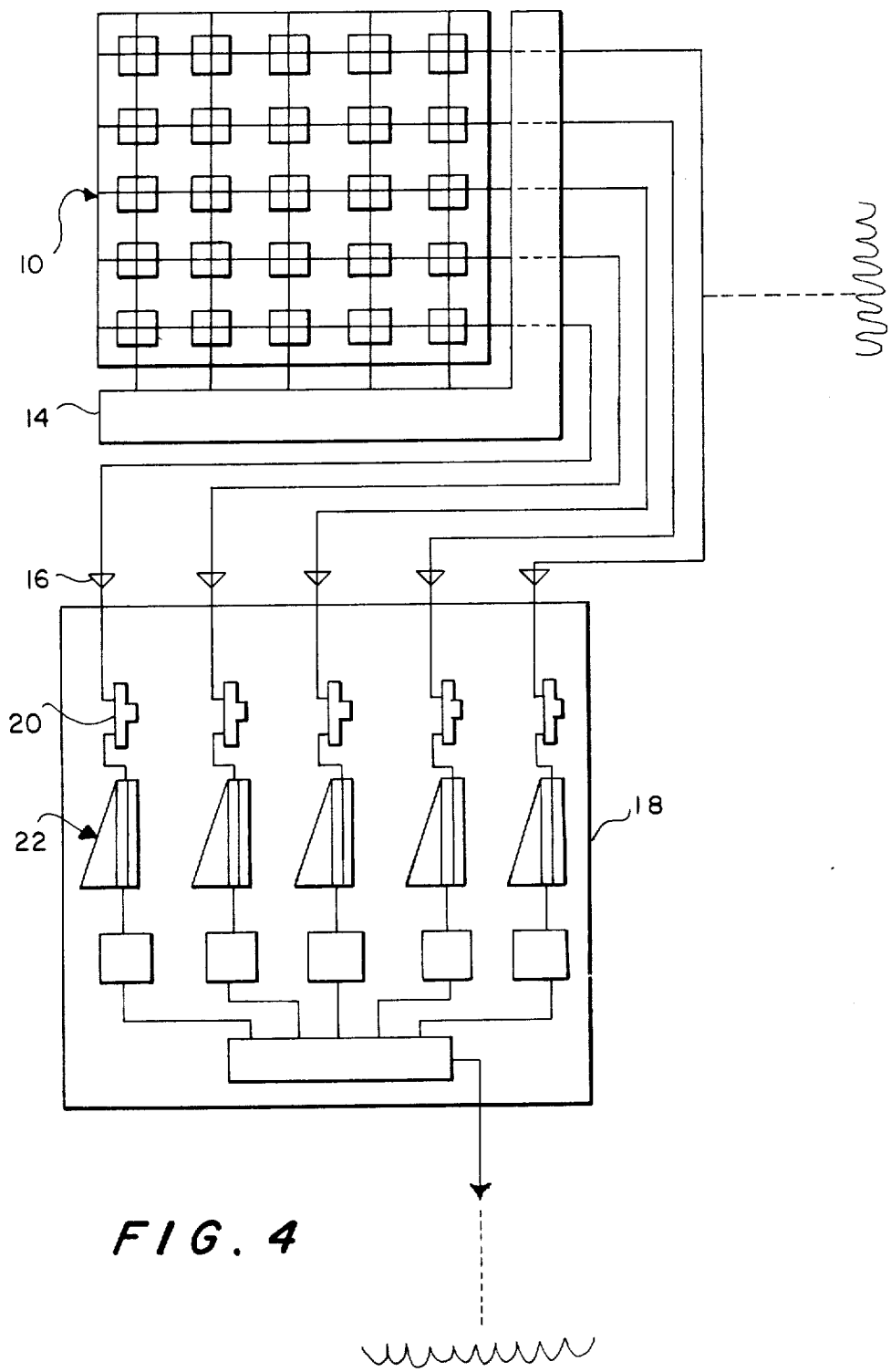
FIG. 4 is a block diagram in schematic form showing some components of a somewhat different version of the embodiment of FIG. 1.

FIG. 4 shows a slightly different version of the embodiment of FIG. 1. In this embodiment, all detector elements 12 of a single column of CID module 10 are read out simultaneously starting, for example, with the column at the extreme right side of the module and then proceeding to the adjacent column at its left until the column on the extreme left is reached. Each row, then, is connected to its own preamplifier 16 and each preamplifier 16 to its own gate 20 and CCD register 22. Note that only one CID module and signal processor is shown and that there would also be other modules, signal processors, final multiplexer, etc.

Obviously many modifications and variations of the present invention are possible in light of the above teaching. It is therefore to be understood that within the scope of the appended claims the invention be practiced otherwise than as specifically described.

What is claimed and desired to be secured by Letters Patent of the United States is:

1. A focal-plane array for scanning an IR image comprising:
    a plurality of IR-sensitive CID modules arranged substantially in a row in the focal plane of an IR image so that substantially no space in said row is left uncovered by any module, all modules being arranged for simultaneous, parallel, relative movement with respect to the IR image,
    each module comprising a two-dimensional configuration of CID elements arranged in rows and columns; and
    means for providing series-parallel scan of the image, the column axes of the CID elements being in the same direction as said relative movement so that optical scanning of the image will be in the series-parallel mode.

2. An array as in claim 1, wherein said CID modules are of the INSb tupe.

3. A device for forming an output signal comprising a chain of pulses each of which corresponds to a different areal element of a scanned IR image, said device comprising, in combination:

a plurality of IR-sensitive, CID modules arranged substantially in a row in the focal plane of an IR image so that substantially no space in said row is left uncovered by any module, all modules being arranged for simultaneous, parallel, relative movement with respect to the IR image, each module comprising a two-dimemsional configuration of CID elements arranged in rows and columns, the column axes being in the same direction as said relative movement so that optical scanning of the image will be in the series-parallel mode;

means for reading out the CID's in each module in sequence;

a plurality of amplifiers, each being coupled to a different one of said readout means;

a plurality of CCD signal processors, each being coupled to a different one of said amplifiers so that branches are formed, each branch comprising a CID module, its readout means, at least one amplifier and signal processor; and a final multiplexer into which the outputs of all said signal processors feed.

4. A device as in claim 3, wherein each said CCD signal processor comprises:

a plurality of input gates, all receiving the output of the amplifier associated with said signal processor;

a plurality of register packages, each connected to receive the output of a different gate;

a plurality of high-pass filters, each connected to receive the output of a different register package; and an output multiplexer connected to receive the outputs of all said high-pass filters and to provide a multiplexed chain output therefrom.

5. A device as in claim 4, wherein each said register package comprises:

a first CCD shift register;

a tapered CCD TDI register; and a set of parallel transfer gates between said first and said tapered registers, said first register receiving the output signals from its associated input gate and said transfer gates transfering the signals in said first register to said tapered register.

6. A device for forming an output signal comprising a chain of pulses each of which corresponds to a different areal element of a scanned IR image, said device comprising in combination:

a plurality of IR-sensitive, CID modules arranged substantially in a row in the focal plane of an IR image so that substantialy no space in said row is left uncovered by any module, all modules being arranged for simultaneous, parallel, relative movement with respect to the IR image, each module comprising a two-dimensional configuration of CID elements arranged in rows and columns, the column axes being in the same direction as said relative movement so that optical scanning of the image will be in the series-parallel mode;

means for reading out the CID's in each module, the elements in a given column being read-out simultaneously and each column in a given module being read out sequentially;

a plurality of amplifiers coupled to said readout means, each amplifier being coupled to accept the information of the CID's in a different row of each module;

a plurality of CCD signal processors, each being coupled to a different set of amplifiers, the amplifiers coupled to a single CID module comprising a given set, so that branches are formed, each branch comprising a CID module, its reachout means, its associated amplifiers, and a signal processor; and a final multiplexer into which the outputs of all said signal processors feed.

7. Apparatus including a focal-plane array for scanning an IR image comprising:

a module having a plurality of CID IR-detecting elements arranged two-dimensionally in rows and columns;

means for providing relative motion between the module and said IR image so that a series-parallel optical scan of the image is performed;

means for sequentially reading out the signals generated by said CID elements; and means for processing said signals by time-delay-and-integration techniques.

8. Apparatus as in claim 7, including a plurality of said modules.

9. Apparatus as in claim 8, including a plurality of amplifiers, each connected to amplify the signals generated by a different one of said modules.

10. A method employing a CID focal-plane array for scanning an IR image comprising:

forming a plurality of IR-sensitive CID detector elements into a focal-plane array wherein the elements are arranged in parallel rows and columns to form a module;

moving said array and said IR image relative to each other so that optical scanning of the image is in the series-parallel mode;

reading out the signals generated by said elements;

processing said signals using a time delay and integration processing technique.

11. A method as in claim 10, wherein said plurality of elements is formed into a plurality of modules and said relative motion occurs simultaneously between said image and the entire set of said modules so that scanning of all modules is in the series-parallel mode 12. A method as in claim 10, wherein said readout is performed by an x-y readout technique.

13. A method as in claim 11, wherein said readout is performed by an x-y readout technique.

* * * * *